United States Patent
Abbaszadeh

(12) 
(10) Patent No.: US 6,563,877 B1
(45) Date of Patent: May 13, 2003

(54) SIMPLIFIED BLOCK SLIDING WINDOW IMPLEMENTATION OF A MAP DECODER

(75) Inventor: Ayyoob Dehgani Abbaszadeh, Salt Lake City, UT (US)

(73) Assignee: L-3 Communications Corporation, New York, NY (US)

( * ) Notice: Subject to any disclaimer, the term of this patent is extended or adjusted under 35 U.S.C. 154(b) by 0 days.

(21) Appl. No.: 09/282,260

(22) Filed: Mar. 31, 1999

Related U.S. Application Data

(60) Provisional application No. 60/080,339, filed on Apr. 1, 1998.

(51) Int. Cl.[7] .............................................. H04B 14/04
(52) U.S. Cl. ...................... 375/242; 375/262; 375/265; 375/340; 375/341; 714/792; 714/794; 714/795; 714/796
(58) Field of Search ................................ 375/341, 262, 375/340, 261, 265, 242, 244; 714/792, 794, 795, 796; 341/143

(56) References Cited

U.S. PATENT DOCUMENTS

| | | | | |
|---|---|---|---|---|
| 5,214,672 A | * | 5/1993 | Eyuboglu et al. | 375/254 |
| 5,721,543 A | * | 2/1998 | Johnson et al. | 341/50 |
| 5,721,746 A | * | 2/1998 | Hladik et al. | 714/792 |
| 6,192,084 B1 | * | 2/2001 | Miyauchi et al. | 375/262 |

OTHER PUBLICATIONS

Benedetto, S. et al., "Soft–Output Decoding Algorithms in Iterative Decoding of Turbo Codes", TDA Progress Report 42–124, Feb. 15, 1996, pp. 63–85.

Yuan, Jianming et al., "Multiple Output Sliding Window Decoding Algorithm for Turbo Codes", Proc. CISS 1996, pp. 515–520.

Lodge et al., "Separable Map 'Filters' For The Decoding Of Product And Concatenated Codes", Proc. IEEE ICC, 1993, pp. 1740–1745.

* cited by examiner

Primary Examiner—Shuwang Liu
(74) Attorney, Agent, or Firm—Perman & Green, LLP

(57) ABSTRACT

A block sliding window data decoder includes a forward recursion calculator and a plurality of backward recursion calculators including a first backward recursion calculator and a second backward recursion calculator that receives inputs from the first backward recursion calculator. The first backward recursion calculator operates every D cycles to perform a backward recursion over received input signals, while assuming that all future states are equally likely. The decoder further includes a symbol probability calculator that receives inputs from the forward recursion calculator and from the first backward recursion calculator. A memory of the decoder stores the input signals and is organized as N cells, wherein for each cycle one of the N cells is written while N−1 of the cells are read and their contents provided to the forward recursion calculator and to the first and second backward recursion calculators. Each calculation cell of the decoder includes a normalizer for normalizing the input signal and signals processed by the forward recursion calculator and the first and second backward recursion calculators. The normalizer is implemented using AND functions.

7 Claims, 13 Drawing Sheets

NOTATION:
$A_K(S_i)$ IS REPRESENTED IN m BITS, WHERE
$A_K(S_i, m)$ IS THE MSB (SIGN BIT)
$A_K(S_i, m-1)$ IS THE 2nd MSB
⋮
$A_K(S_i, 1)$ IS THE LSB

SIMPLIFIED BLOCK SLIDING WINDOW IMPLEMENTATION OF A MAP DECODER

CLAIM OF PRIORITY FROM A COPENDING PROVISIONAL PATENT APPLICATION

Priority is herewith claimed under 35 U.S.C. §119(e) from copending Provisional Patent Application No. 60/080,339, filed Apr. 1, 1998, entitled "Simplified Block Sliding Window Implementation of MAP Decoders", by Ayyoob D. Abbaszadeh. The disclosure of this Provisional Patent Application, including the Appendix A, is incorporated by reference herein in its entirety.

FIELD OF THE INVENTION

This invention relates generally to digital transmission systems and, in particular, to Maximum Posteriori Probability (MAP) and similar decoders that use a sliding window technique.

BACKGROUND OF THE INVENTION

Of most interest to this invention are digital transmission systems where a received signal from a channel is a sequence of wave forms whose correlation extends well beyond T, the signaling period. There can be many reasons for this correlation, such as coding, intersymbol interference, or correlated fading. It is known that an optimum receiver in such situations cannot perform its decisions on a symbol-by-symbol basis, so that deciding on a particular information symbol $U_k$ involves processing a portion of the received signal $T_d$ seconds long, with $T_d > T$. The decision rule can be either optimum with respect to a sequence of symbols, or with respect to the individual symbol, $U_k$.

Reference can be had to a journal article entitled "Soft-Output Decoding Algorithms in Iterative Decoding of Turbo Codes", S. Benedetto et al., TDA Progress Report 42–124, pp. 63–87, Feb. 15, 1996 (incorporated by reference herein), wherein the authors report that the most widely applied algorithm for the first kind of decision rule is known as the Viterbi algorithm. In an optimum formulation of the Viterbi algorithm it is required to wait for decisions until an entire sequence has been received. In practical implementations, this drawback is overcome by anticipating decisions (single or in batches) on a regular basis with a fixed delay, D. A choice of D five to six times the memory of the received data is widely recognized as presenting a good compromise between performance, complexity, and decision delay.

Optimum symbol decision algorithms base their decisions on the maximum a posteriori probability (MAP). This class of algorithms has been known for several decades, although they are generally much less popular than the Viterbi algorithm, and are not commonly applied in practical systems. One reason for this is that the MAP algorithms typically yield performance in terms of symbol error probability that is only slightly superior to the Viterbi algorithm, yet they present a much higher complexity. Recently, however, interest in these algorithms has increased in connection with the problem of decoding concatenated coding schemes.

Concatenated coding schemes (a class which may include product codes, multilevel codes, generalized concatenated codes, and serial and parallel concatenated codes) were first proposed by Forney (G. D. Forney, Jr., "Concatenated Codes", Cambridge, Mass., MIT, 1966) as a means of achieving large coding gains by combining two or more relatively simply "constituent" codes. The resulting concatenated coding scheme is a powerful code endowed with a structure that facilitates decoding, such as by using so-called stage decoding or iterated stage decoding.

In order to function properly these decoding algorithms cannot limit themselves to simply passing the symbols decoded by an inner decoder to an outer decoder. Instead they need to exchange some kind of soft information. As was proved by Forney, an optimum output of the inner decoder should be in the form of the sequence of the probability distributions over the inner code alphabet conditioned on the received signal, the a posteriori probability (APP) distribution. There have been several attempts to achieve, or at least approach, this goal. Some of these approaches are based on modifications of the Viterbi algorithm so as to obtain at the decoder output some reliability information, in addition to the "hard"-decoded symbols. This has led to the concept of an "augmented-output," or the list-decoding Viterbi algorithm, and to the soft-output Viterbi algorithm (SOVA). However, these approaches can be suboptimal, as they are unable to supply the required APP. A different approach employs the original symbol MAP decoding algorithms with the aim of simplifying them to a form suitable for implementation. Of particular interest are soft-decoding algorithms as a main building block of an iterative stage decoding of parallel concatenated codes. These algorithms are particularly interesting since the advent of the so-called turbo codes (C. Berrou et al., Near Shannon Limit Error-Correcting Coding and Decoding: Turbo Codes", Proceedings of ICC'93, Geneva, pp. 1064–1070, May 1993). These codes are parallel concatenated convolutional codes (PCCC) whose encoder is formed by two (or more) constituent systematic encoders joined through an interleaver. In this approach the input information bits feed the first encoder and, after having been interleaved by the interleaver, enter the second encoder. The codeword of the parallel concatenated code includes the input bits to the first encoder followed by the parity check bits of both encoders. Generalizations to more than one interleaver and two parallel concatenated convolutional codes are possible.

The suboptimal iterative decoder is modular and contains a number of equal component blocks formed by concatenating soft decoders of the constituent codes (CC), separated by the interleavers used at the encoder side. By increasing the number of decoding modules and, thus, the number of decoding iterations, bit-error probabilities as low as $10^{-5}$ at $E_b/N_o = 0.0$ dB for rate 1/4 PCCC have been shown by simulation. A version of turbo codes employing two eight-state convolutional codes as constituent codes, an interleaver of 32×32 bits, and an iterative decoder performing two and one-half iterations with a complexity of the order of five times the maximum-likelihood (ML) Viterbi decoding of each constituent code is presently available on a chip, yielding a measured bit-error probability of $0.9 \times 10^{-6}$ at $E_b/N_o = 3$ dB. Upper bounds to the ML bit-error probability of PCCCs have been proposed. As a by-product, it has been shown by simulation that iterative decoding can approach quite closely the ML performance. The iterative decoding algorithm is a simplification whose regular steps and limited complexity seem quite suitable to very large-scale integration (VLSI) implementation. Simplified versions of the algorithm have been proposed and analyzed in the context of a block decoding strategy that requires trellis termination after each block of bits. A similar simplification has been used for a hardware implementation of the MAP algorithm.

In an article entitled "Multiple Output Sliding Window Decoding Algorithm for Turbo Codes", Proc. CISS 1996, Baltimore Md., pp. 515–520 (incorporated by reference herein), J. Yuan et al. report on a previous sliding window MAP decoding algorithm (SW-BCJR, where BCJR indicates the original authors), in which the decoder operates on a fixed memory span and APP outputs are forced with a given delay. This approach is said, however, to dramatically increase the required computation relative to the non-windowed MAP algorithm.

More particularly, these authors show that the non-windowed MAP algorithm requires that the entire sequence must be received before starting the decoding process. In order to avoid this delay, and to reduce memory requirements, the sliding window approach operates with a fixed memory span D, which is small compared to the frame or block size. While saving both memory and delay, it is also shown that the sliding window MAP algorithm must, at every time index k, in order to obtain the probability of the state of the encoder at state $S_i$, conditioned on future received symbols ($B_k(S_i)$), recursively backwards compute for the entire sliding window length, as opposed to once for the entire frame length for the non-windowed MAP algorithm. In this regard a term $\acute{a}_k(S_i)$ is the probability of the state $S_i$ of the encoder at time k conditioned on the past and current received symbols, $\alpha_k(S_i,u_k)$ is the a posterior transition probability from state $S_i$ at time k and encoder data input $u_k$, and $\Gamma_k(x)$ is the joint probability of the channel input symbol $x_k$ and channel output symbol $y_k$.

In order to reduce this computational load, J. Yuan et al. propose a multiple siding window MAP algorithm wherein the window is advanced multiple stages at each cycle, thereby sliding the window fewer times and reducing the number of computations.

While overcoming certain of the deficiencies of the non-windowed and windowed MAP algorithms, the multiple output sliding window approach of J. Yuan et al. still does not provide an optimum solution to the efficient decoding of turbo and other similar coded data.

OBJECTS AND ADVANTAGES OF THE INVENTION

It is a first object and advantage of this invention to provide an improved windowed MAP decoding technique that overcomes the foregoing and other problems.

It is another object and advantage of this invention to provide a simplified sliding windowed MAP decoder hardware architecture that overcomes the foregoing and other problems.

SUMMARY OF THE INVENTION

The foregoing and other problems are overcome and the objects of the invention are realized by methods and apparatus in accordance with embodiments of this invention.

A block sliding window data decoder includes a forward recursion calculator and a plurality of backward recursion calculators, a memory, and a symbol probability likelihood calculator. A first backward recursion calculator (B1) and a second backward recursion calculator (B2) are both initialized every D cycles, where D is the sliding window size. With the modified sliding window approach, two backward iteration calculations of depth D are performed every D cycles, during which D information bits are decoded. The first backward recursion calculator, which may also be referred to as a "front runner", operates every D cycles to perform a backward recursion over the most recently received input signals, with the recursion initialized with all equal likelihood states. At the end of D recursions the final result of the calculation from the front runner backward recursion calculator is loaded into the second backward recursion calculator as the initial conditions for the second backward recursion calculator. This occurs once every D cycles. However, every value calculated by the second backward recursion calculator is provided to the symbol likelihood probability calculator. The forward recursion calculator is initialized only once during decoding of each block of information and generates the necessary data. The symbol likelihood probability calculator receives inputs from the forward recursion calculator and from the second backward recursion calculator, and from the memory during every cycle.

The memory of the decoder stores the input signals and is organized as M cells, where M is equal to four in a presently preferred, but not limiting, embodiment of this invention. For each cycle one of the four cells is written while M-1 or three of the cells are read and their contents provided to the forward recursion calculator, the first and second backward recursion calculators, and to the symbol probability likelihood calculator. During each D cycle period one of the four memory cells is written while the remaining three cells are read. This process continues every D cycles.

The forward and backward recursion calculators of the decoder each include a normalizer for normalizing the signals processed by these units. The normalizer is simplified as compared to the prior art and is implemented, preferably, with logical AND functions.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Before describing the present invention, it is first noted that non-windowed, sliding window, and block sliding window decoders can all be implemented in the probability domain or in the log probability domain. In the literature, such as the above-referenced Benedetto et al. article entitled "Soft-Output Decoding Algorithms in Iterative Decoding of Turbo Codes", S. Benedetto et al., TDA Progress Report 42–124, pp. 63–87, Feb. 15, 1996, a specific notation is used to distinguish between these two cases.

More particularly, lower case $\{\tilde{a},\acute{a},\hat{a}\}$ indicate the probability domain while upper case $\{\tilde{A},\acute{A},B\}$ indicate the log probability domain.

Figure 1A:
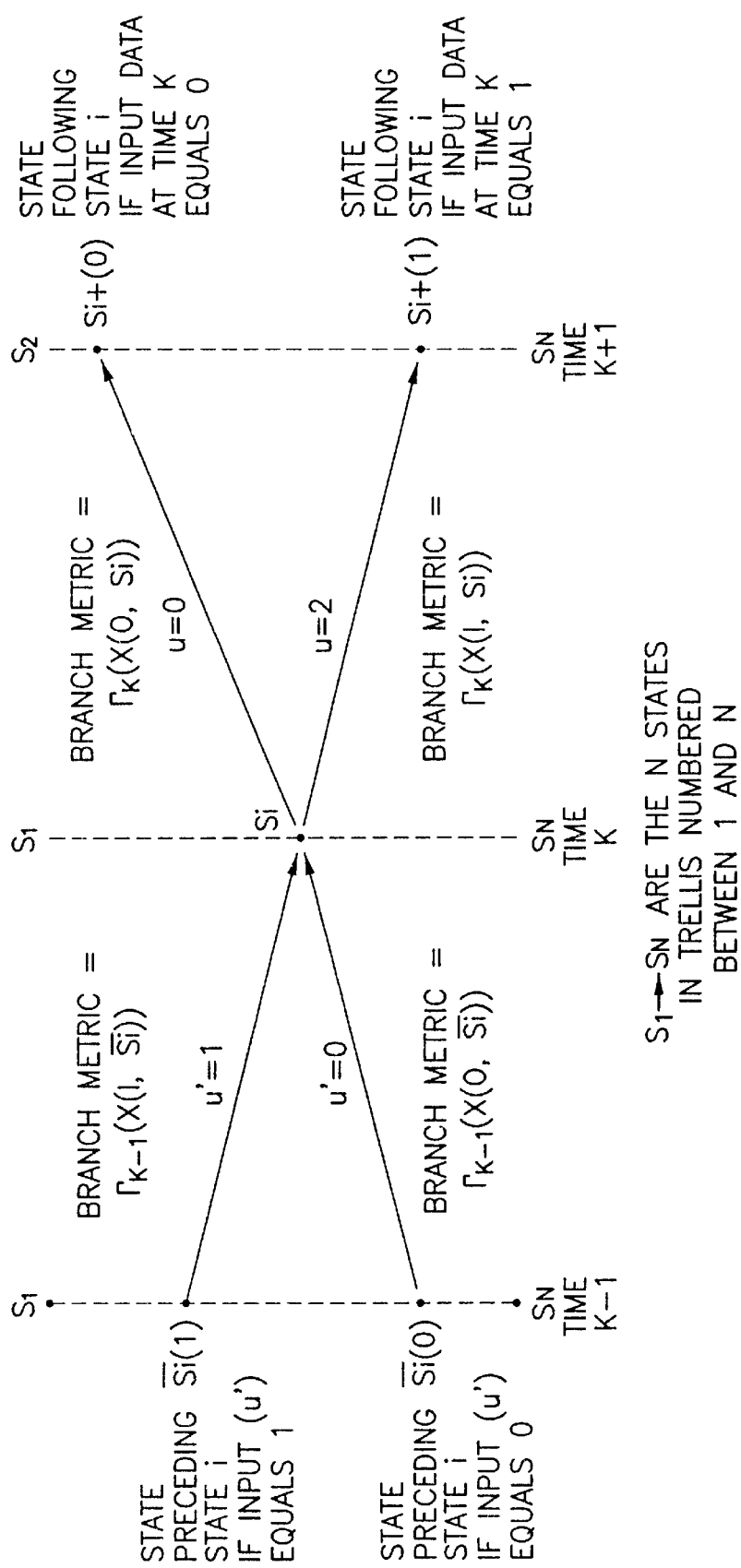
FIG. 1A is a diagram that illustrates a portion of a decoder trellis and various notations used in description of the invention.
Figure 1B:
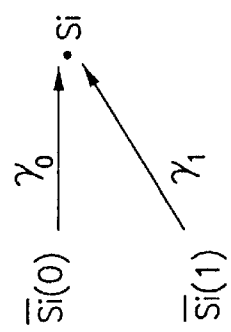
FIG. 1B shows one node of the trellis of FIG. 1A.

As to the major distinction between these two domains, consider one node in the trellis of FIG. 1A that is shown in FIG. 1B, where it is evident that multipliers are required. For the LOG-Domain case:

$A(S_i) \log \acute{a}(S_i)$ $\tilde{A}_o \log (\tilde{a}_o) \; \tilde{A}_1 = \log(\tilde{a}_1)$ For the LOG-MAP case:

MAX-LOG-MAP: $A(s_i)$=As LOG-MAP with no correction term FIG. 1A is a diagram that illustrates a portion of a decoder trellis and the various notations used in the ensuing description.

Figure 2:
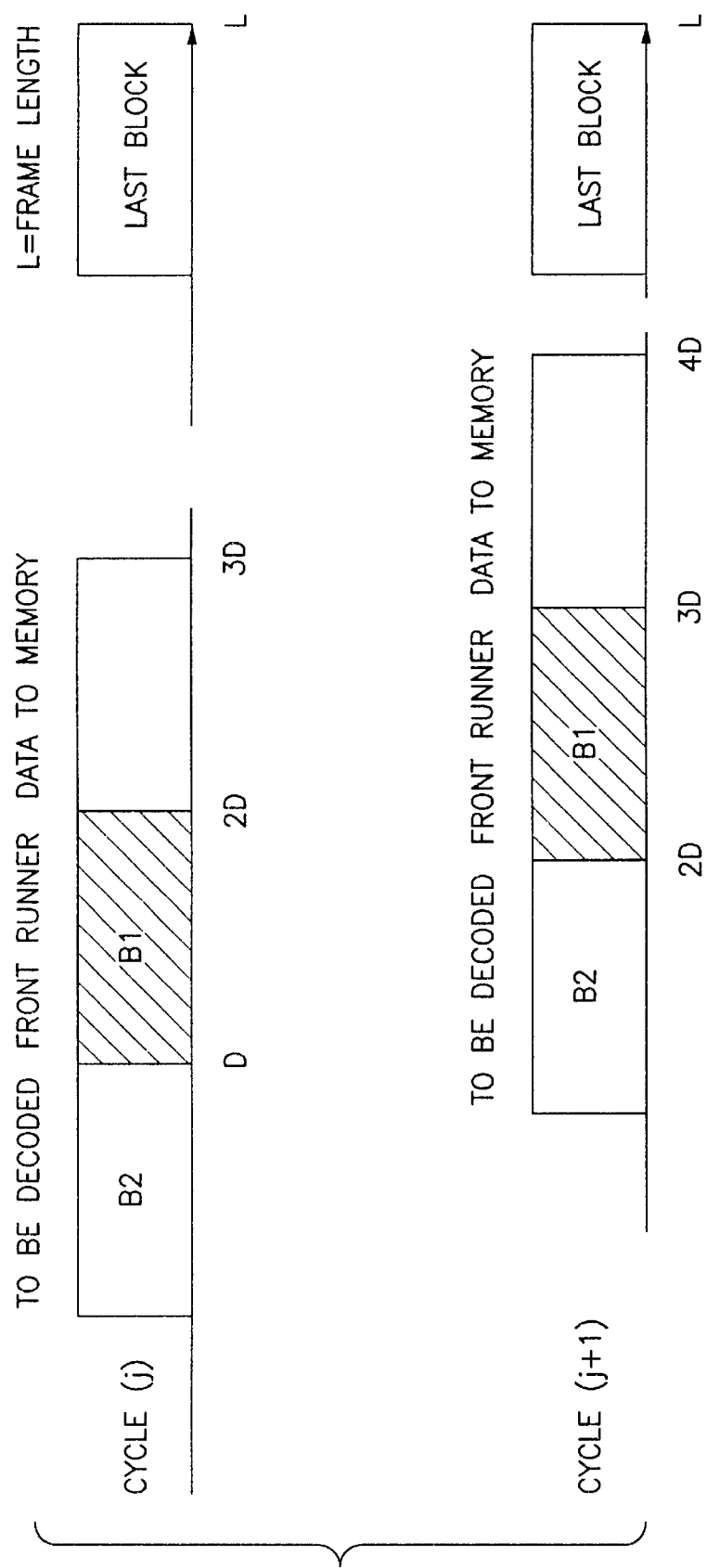
FIG. 2 depicts a sliding window block definition, timing, and an illustration of tasks.
Figure 3:
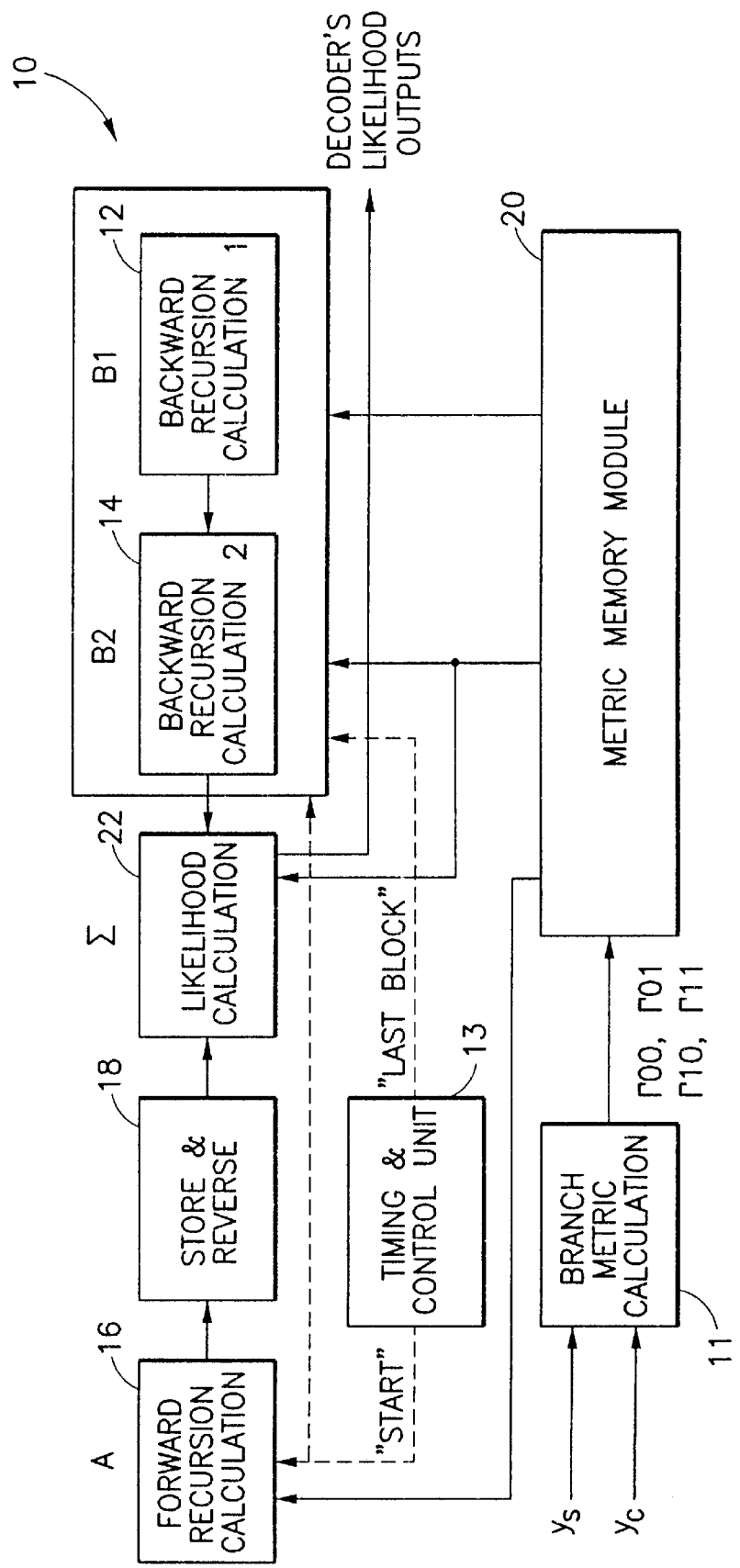
FIG. 3 is a block diagram that illustrates a decoder having two concatenated backward recursion calculator modules B1 and B2 that operate with a single forward recursion calculation module A, a compact memory module that stores branch metrics, and a likelihood calculation unit.

FIG. 2 and FIG. 3 illustrate an aspect of this invention, wherein the decoder 10 of FIG. 3 includes two concatenated backward recursion calculator modules B1 and B2 (12, 14) that operate with a single forward recursion calculator module A (16) and with a memory module (20) that stores branch metrics. Also included is a branch metric calculation unit (11) and a timing and control unit (13) (which generates "Start" and "Last Block" signals, described in further detail below). The presently preferred decoder 10 embodiment eliminates the necessity for receiving the entire data block in order to begin the backward traceback, and hence reduces the decoding latency. This implementation reduces the memory requirements and data processing significantly over the conventional techniques.

Referring also to FIG. 2, the decoder 10 of FIG. 3 operates over windows of cycle size D, where D may be any positive integer preferably greater than one and less than the total block size. For simplicity of design it is preferred to choose D such that the frame length is an integer multiple of D. In addition, D should be large enough not to cause major degradations in the performance of the decoder 10.

The calculation of the first traceback module B1 12 is begun every D cycles (e.g., every 10 clocks), and the recursion equations are initialized so as to assume that all states are equally likely. For every state within the trellis one needs to perform B1 and B2 calculations. All of the B1 and B2 calculations can be done in parallel or in series, and in the presently preferred embodiment the calculations are performed in parallel. The output of the forward recursion module 16 is provided to a memory 18 which stores, delays and reverses the order of the calculated forward recursion results. The second memory 20, described below in greater detail, simultaneously stores new branch metric input signals ($\Gamma$) while outputting previously stored branch metric ($\Gamma$) signals to the backwards recursion calculators B1 12, B2 14, the forward recursion calculator A 16, and the symbol probability likelihood calculator $\Sigma$22. The likelihood calculator 22 receives the B2 output, the output from memory 18, and the output from memory 20, and calculates the symbol likelihood probability.

Figure 4:
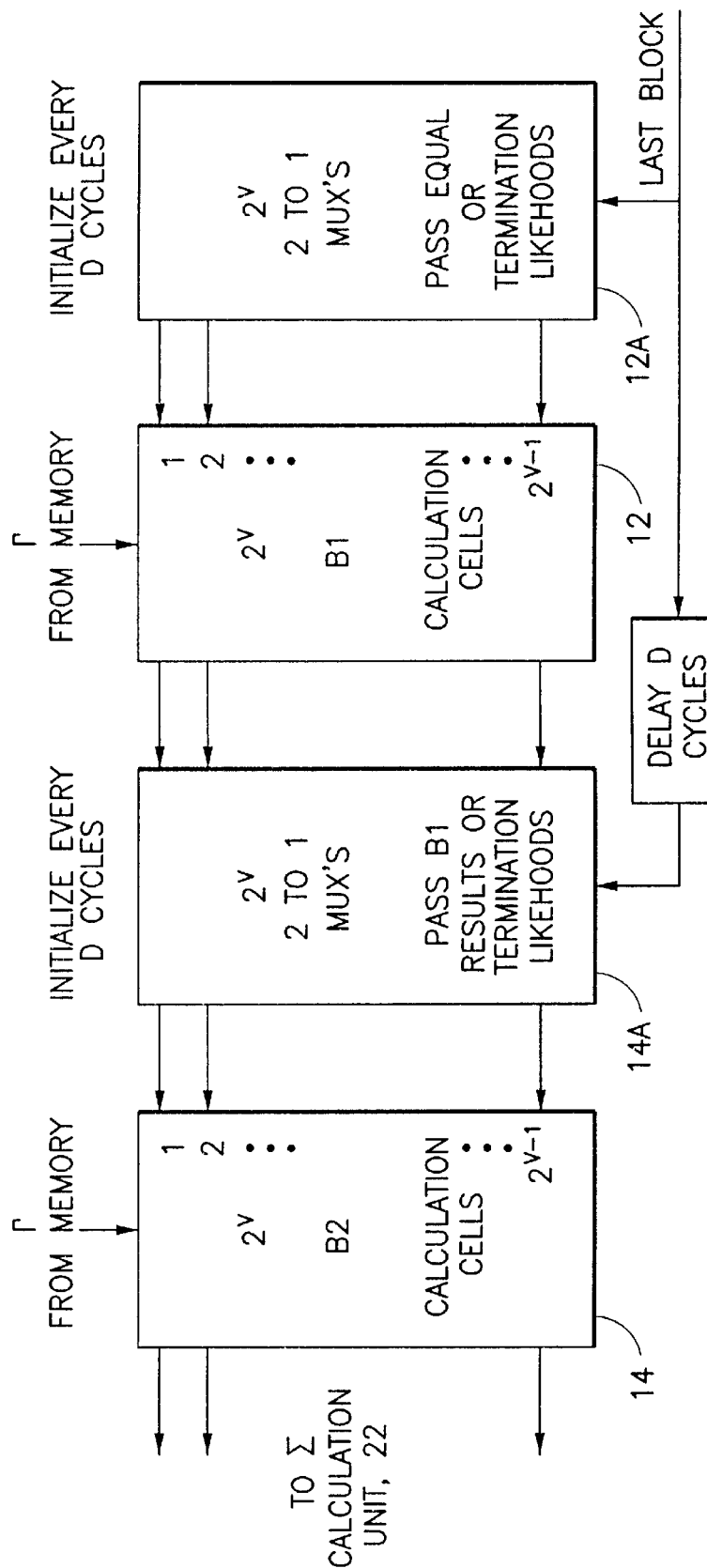
FIG. 4 is a block diagram that illustrates in greater detail the backward recursion calculation modules of FIG. 3.

The concatenated backward traceback modules 12 and 14 together absorb the main bulk of the computation complexity. Details of the concatenated backward traceback modules B1 and B2 are shown in FIG. 4.

Every D cycles both of the B1 and B2 calculators 12 and 14 are initialized. The B1 calculator 12 is initialized always with equally likelihood values for every state except the cycle that relates to the last block within each frame, and is loaded via multiplexer 12A. During this cycle the "Last Block" signal is activated to enable the B1 calculator 12 to be initialized with the termination likelihoods, if any termination has been applied in the encoder (not shown). At the end of every D cycle, the final output of the B1 calculator 12 is loaded, via multiplexer 14A, into the B2 calculator 14 as its initial values for the second backward recursion (the intermediate calculated values from B1 12 are not used.) The second backward calculator B2 14 operates similarly, except that all the states are initialized with the outputs of the B1 calculator 12, via multiplexer 14A. However, one D cycle after the "Last Block" signal is activated the B2 calculator 14 is initialized with the termination likelihood. The intermediate results of the B2 calculator 14 are transferred to the $\Sigma$ likelihood calculator 22 for use in calculating the final likelihood values.

Figure 5:
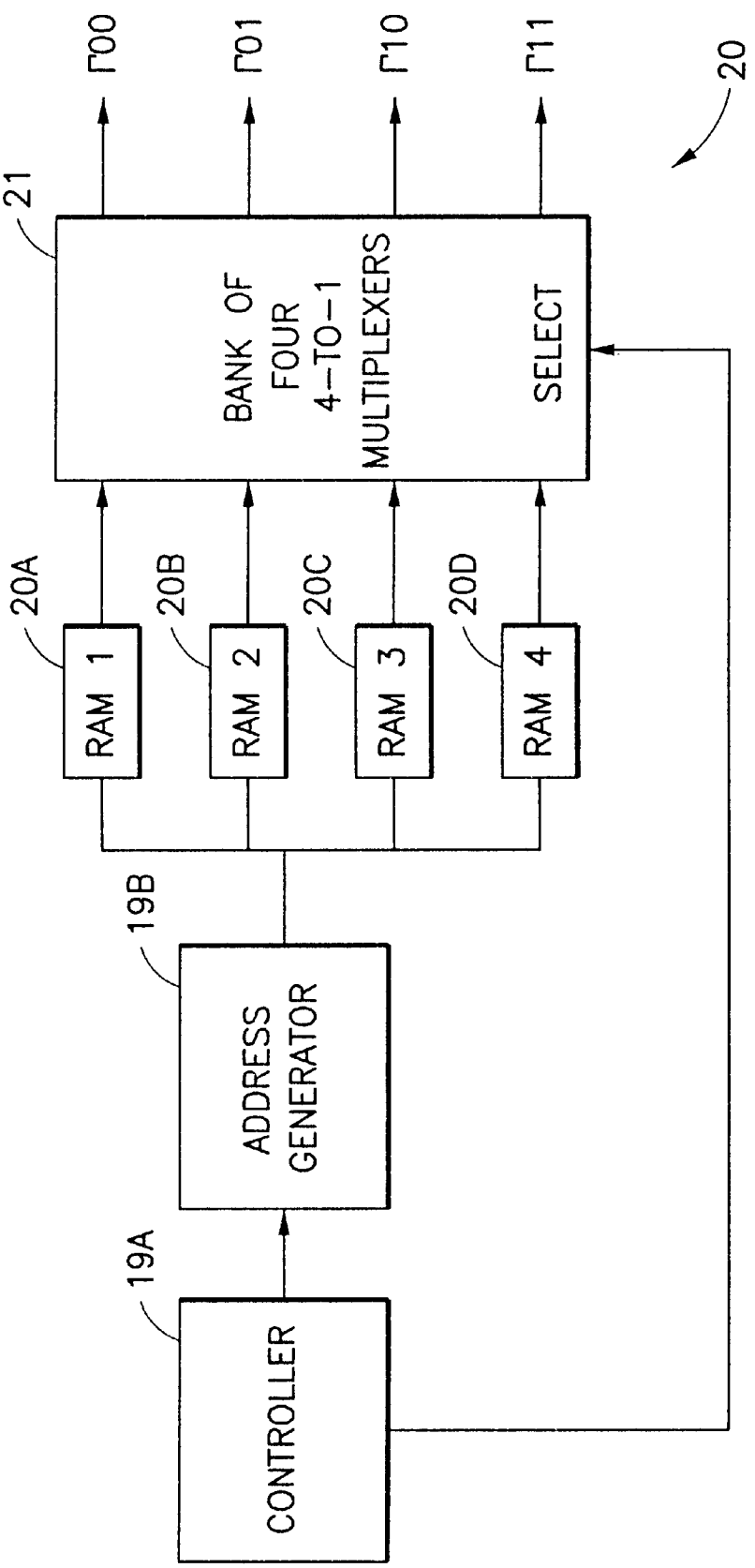
FIG. 5 is a block diagram that illustrates in greater detail the metric memory module of FIG. 3.
Figure 6A:
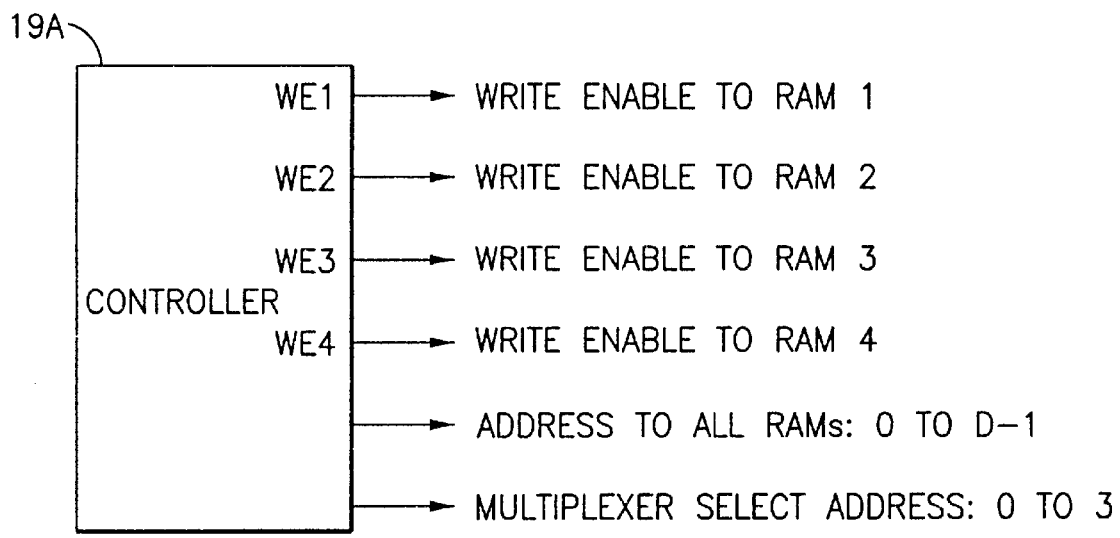
FIG. 6A is a block diagram that illustrates in greater detail outputs of the controller of the metric memory module of FIG. 5.
Figure 6B:
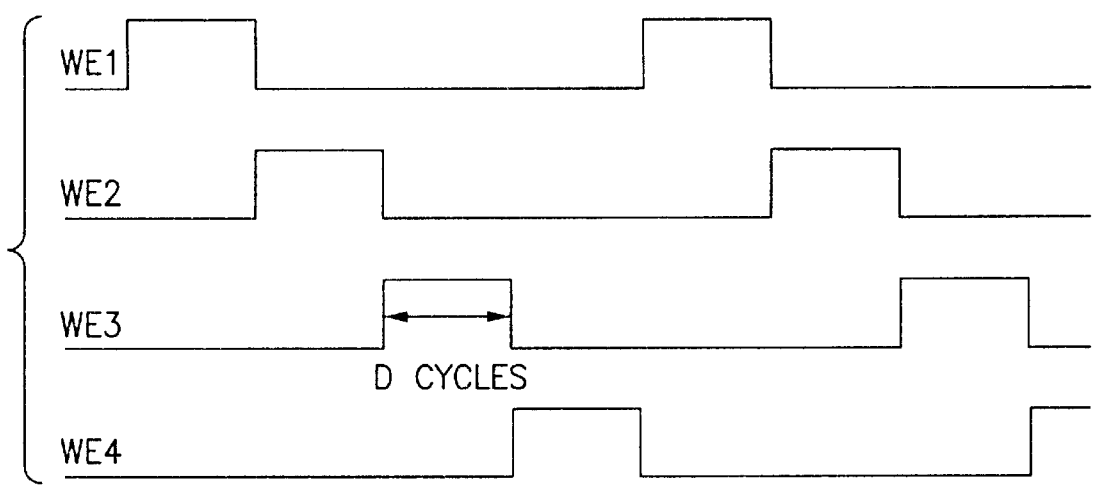
FIG. 6B is a wave form diagram that shows the RAM Write Enable timing for the controller outputs of FIG. 6A.
Figure 6C:
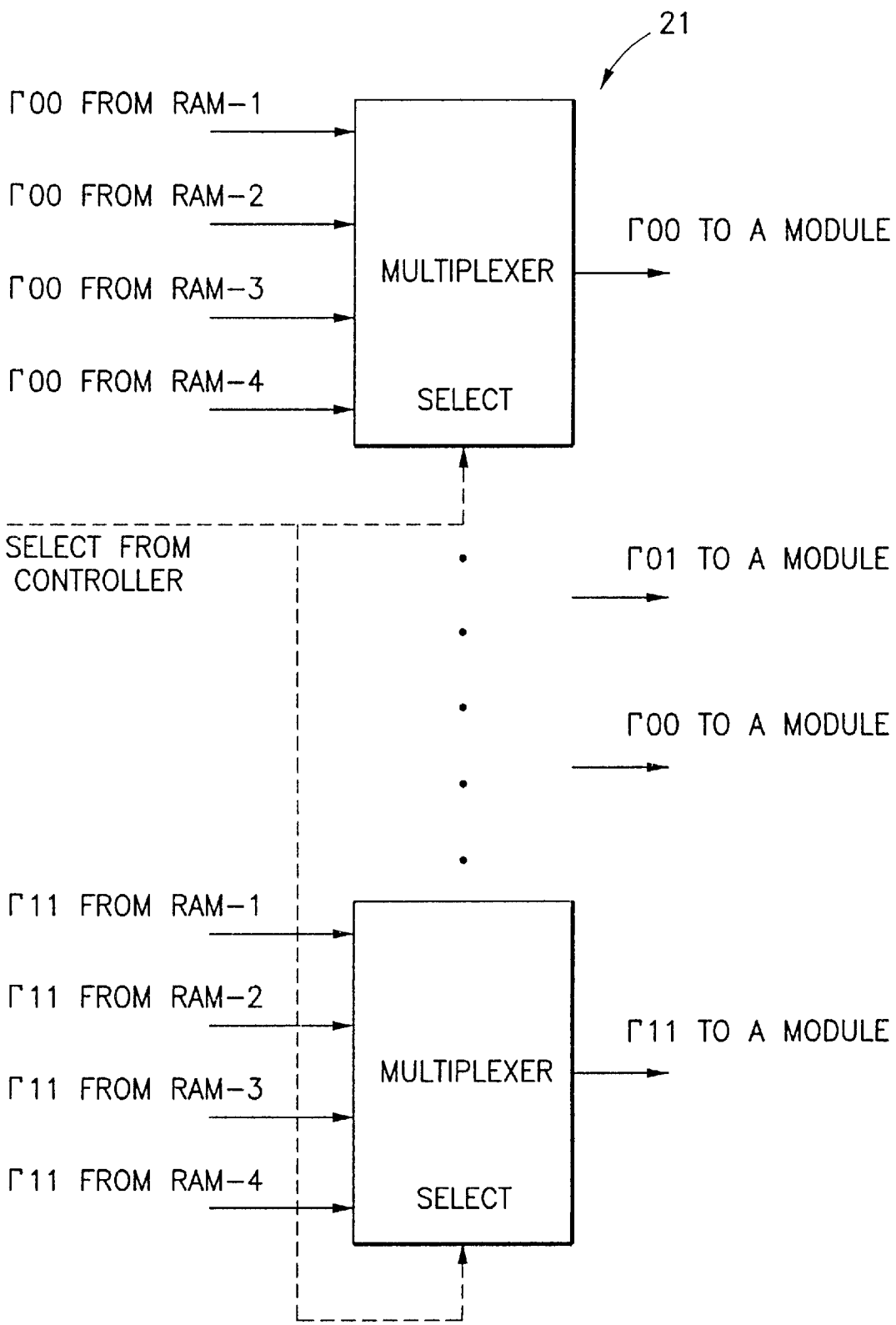
FIG. 6C is a block diagram that illustrates the details of a multiplexer that produces data for the forward recursion calculation module A of FIG. 3.
Figure 7A:
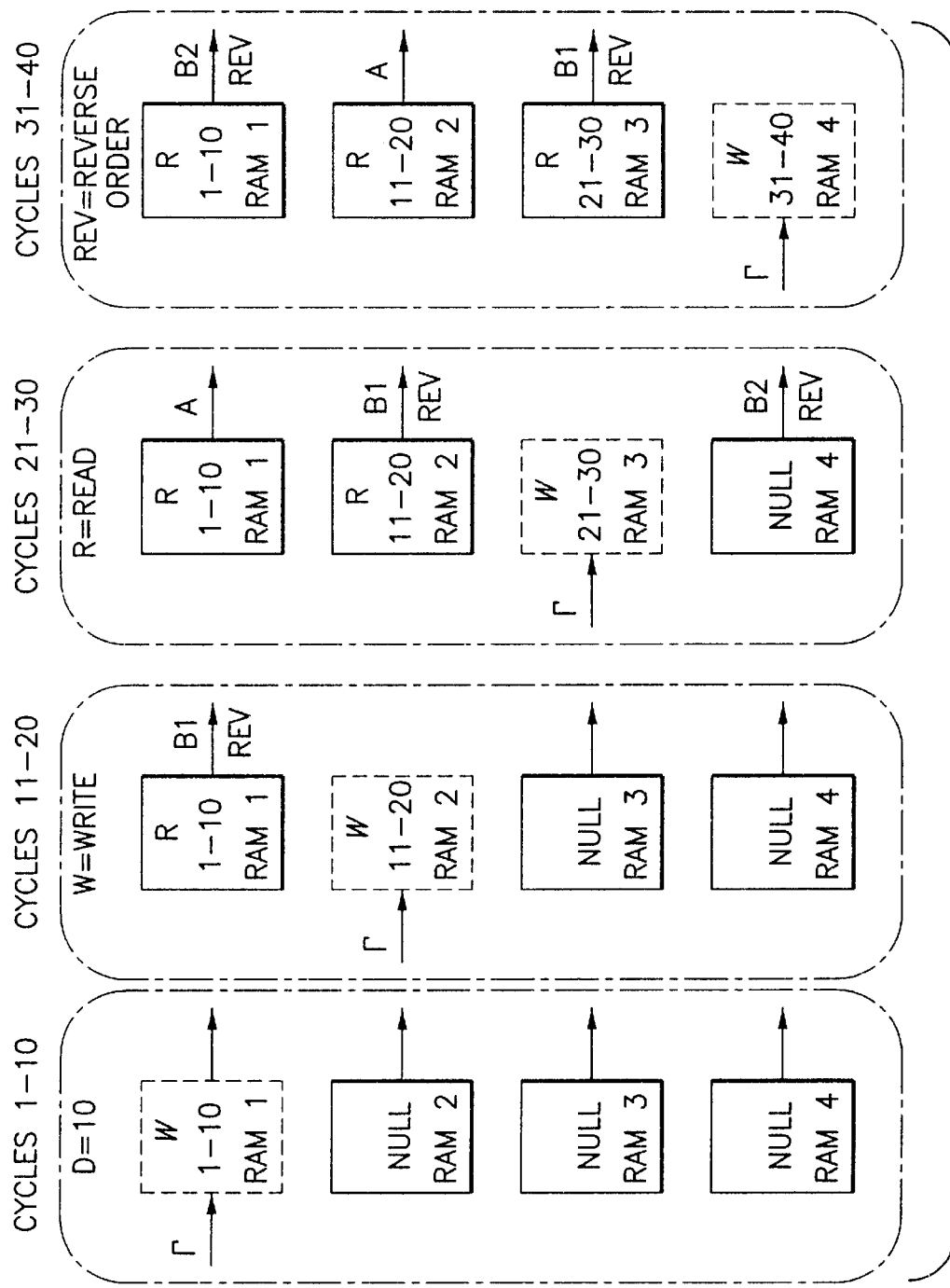
FIGS. 7A and 7B illustrate the operation of the RAMs of the metric memory module during initialization and normal operation, respectively.
Figure 7B:
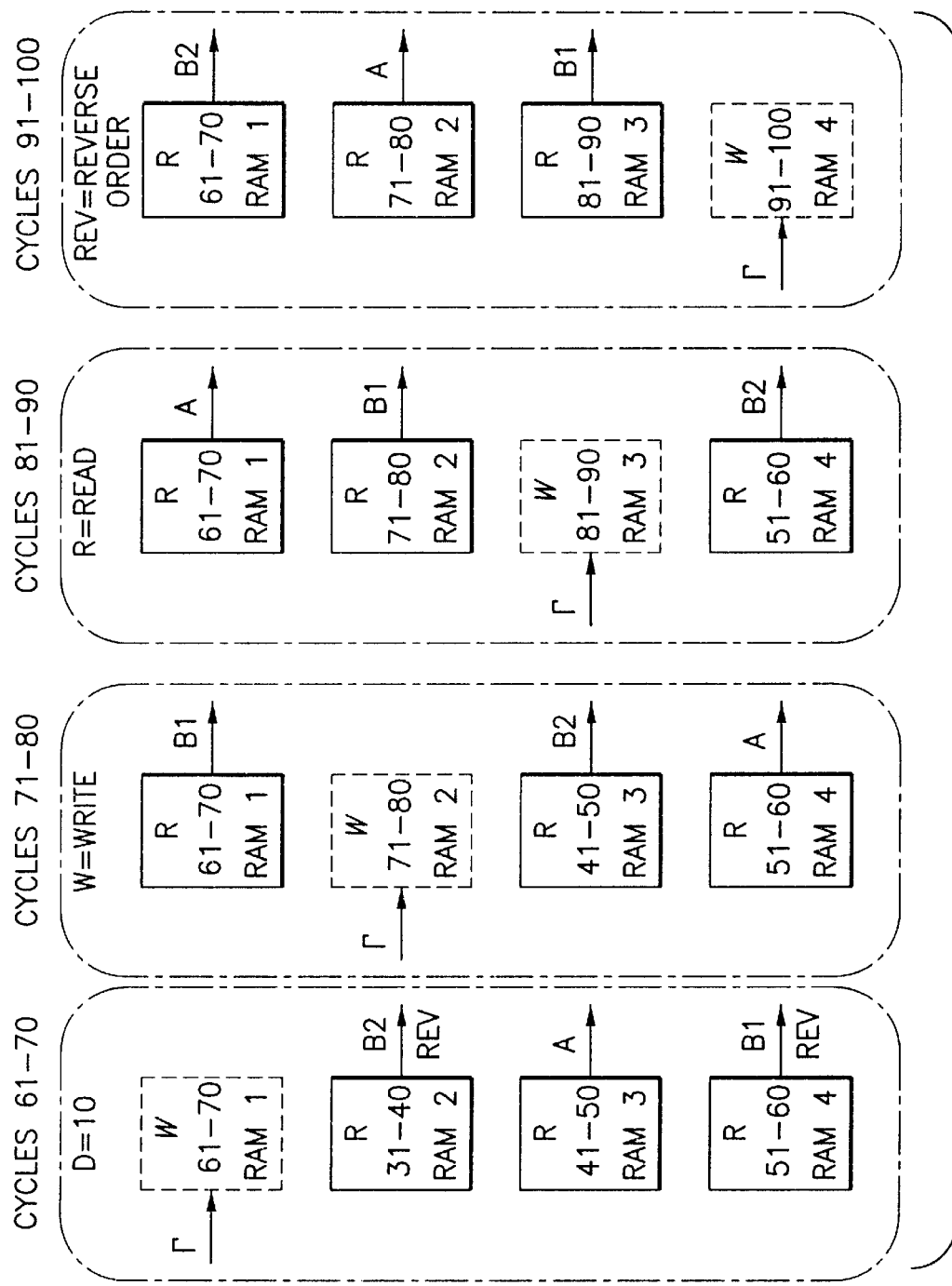

FIGS. 5, 6A–6C, 7A and 7B illustrate a presently preferred hardware embodiment for implementing the memory 20 of FIG. 3. Referring to FIG. 5, the memory 20 is comprised of four separate read/write memory devices, such as high speed semiconductor RAMs 20A–20D. At the output of the RAMs 20A–20D is a bank of four to one multiplexers 21, as partially shown in FIG. 6C, for providing the $\Gamma$ necessary for the forward recursion calculator 16. A memory controller 19A (FIG. 6A) and address generator 19B are included in the memory unit as well. The write enable (WE) RAM inputs are generated by the controller 19A in the manner shown in FIG. 6B (for a case where the memories 20A–20D have a depth of D), so as to obtain a staggered write/read result shown in FIGS. 7A (initialization) and 7B (normal operation). The controller 19A also generates the Select signal which is provided to the bank of multiplexers 21, as shown in FIG. 6C. Although multiple columns of RAMs are shown in FIGS. 7A and 7B it should be appreciated that each column depicts the same four RAMs 20A–20D at successive write enable clock times. Using this technique the circuitry writes a new received $\Gamma$ signal into one RAM while simultaneously reading out previously stored $\Gamma$ signals to the various computation units.

A further aspect of this invention relates to circuitry for normalizing $B_k(S_i)$ in both the B1 and B2 calculators 12 and 14, and $A_k(S_i)$ in the forward recursion calculator 16.

Figure 8:
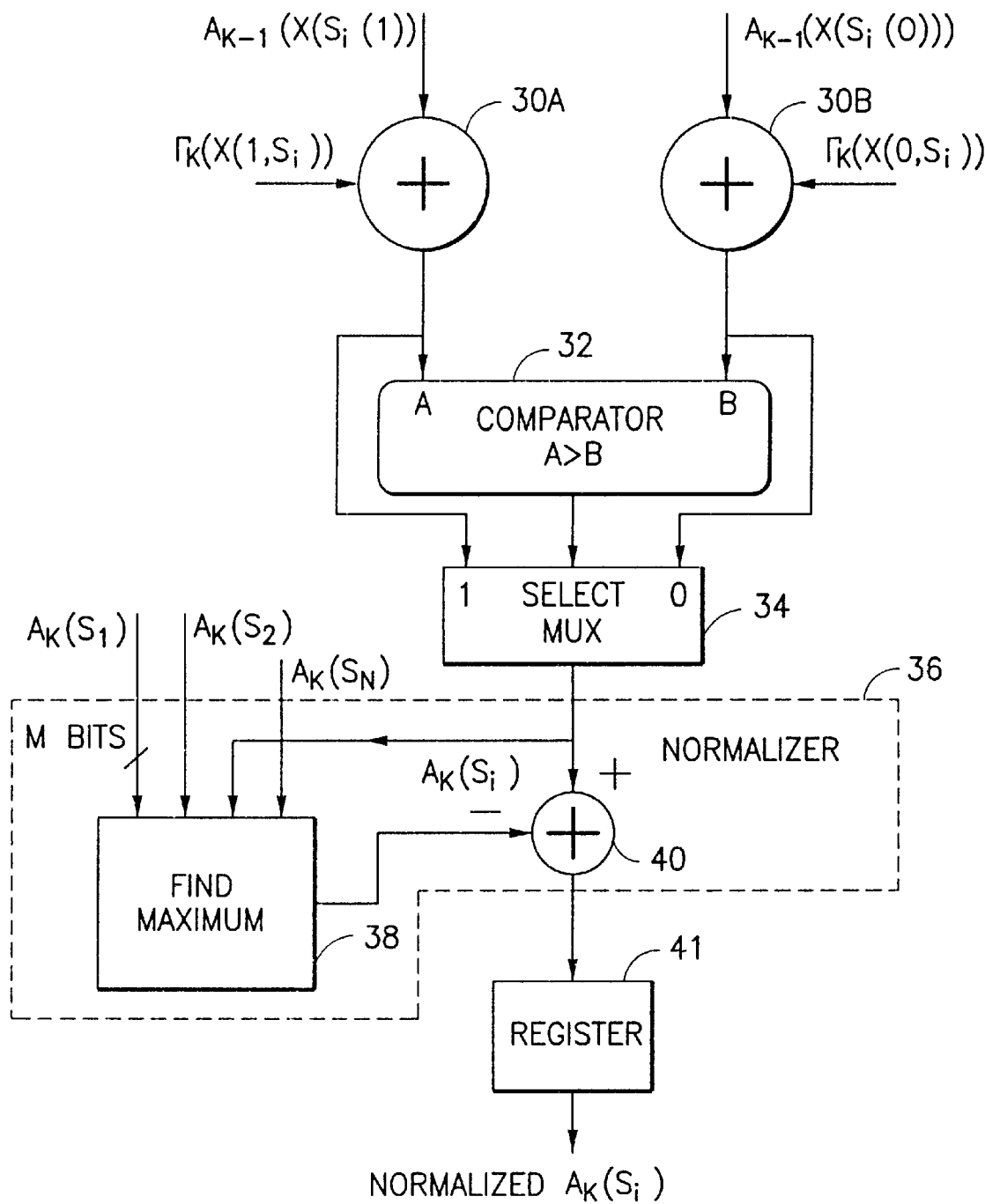
FIG. 8 depicts a prior art MAX_LOG_MAP normalization circuit.

For reference purposes, FIG. 8 depicts a MAX_LOG_MAP version of FIG. A-1 from the above referenced S. Benedetto et al. article "Soft-Output Decoding Algorithms in Iterative Decoding of Turbo Codes", TDA Progress Report 42–124, pp. 63–87, Feb. 15, 1996.

The output of $A_k$ and branch metric summers 30A and 30B are input to a comparator 32 and also to a 2 to 1 MUX 34 that selects the largest of the two summed signals. The maximum $A_k(S_i)$ is input to a normalizer block 36 which includes a Find Maximum block 38. For the case of N states, the circuit operates to find the maximum value for $A_k(\ )$ among all of the states, and then subtracts this maximum value from $A_k(S_i)$ for every state. This then requires the Find Maximum block 38 and subtractor 40. An output register 41 completes the circuit.

Figure 9:
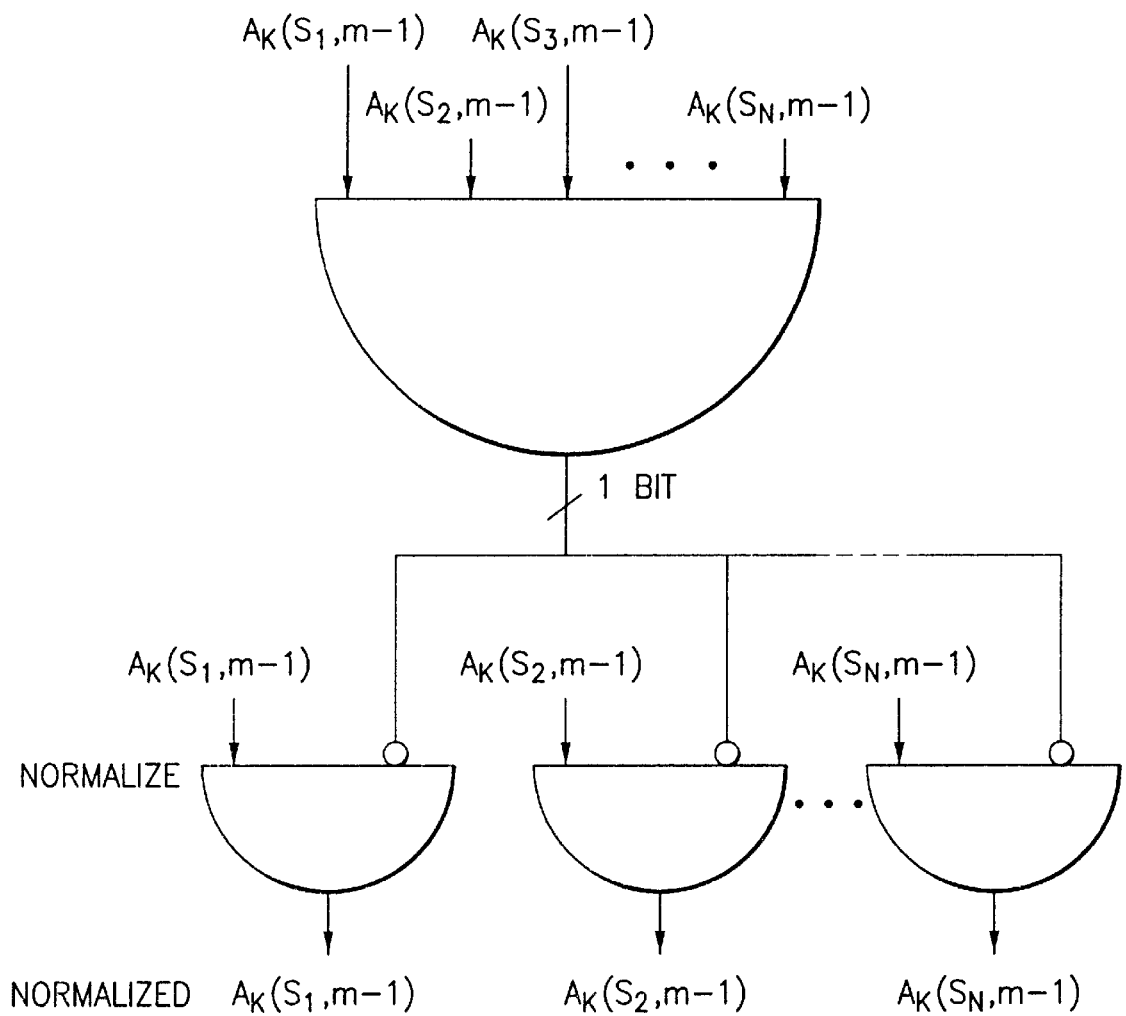
FIG. 9 depicts an improved normalization circuit in accordance with this invention.

FIG. 9 illustrates an improved normalization circuit 45 in accordance with this invention. As can be seen, the improved normalization circuit 49 is implemented as a plurality of logic functions (AND Gates) that connected together and operated as shown in the Figure.

Figure 10:
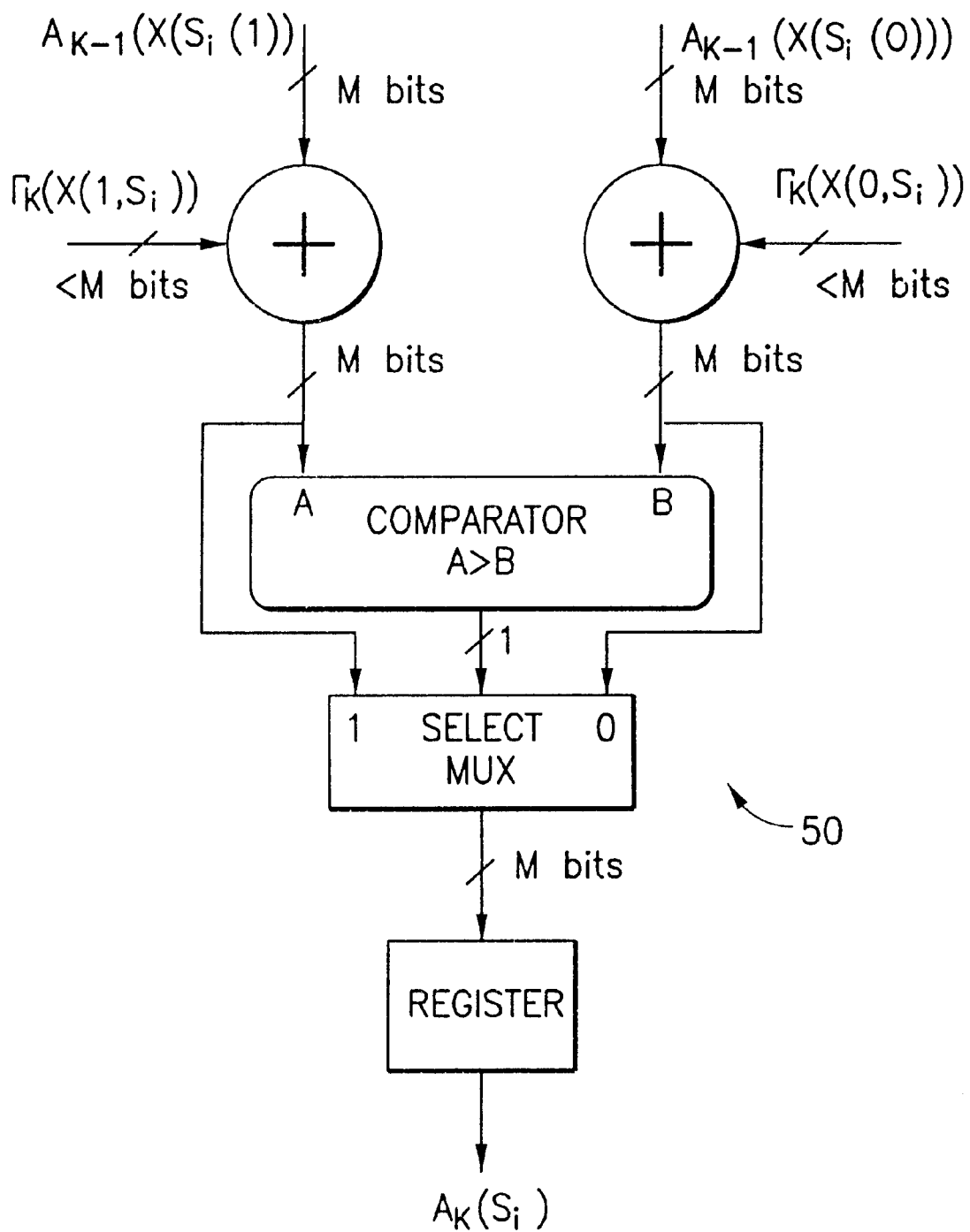
FIG. 10 is a block diagram of a preferred embodiment of one cell of a forward recursion $A_k$ calculator.

FIG. 10 is a block diagram of a preferred embodiment of one cell of a forward recursion $A_k$ calculator 50 that forms a part of the unit 16. It should be noted that a one cell backward recursion $B_k$ calculator is constructed identically.

Figure 11:
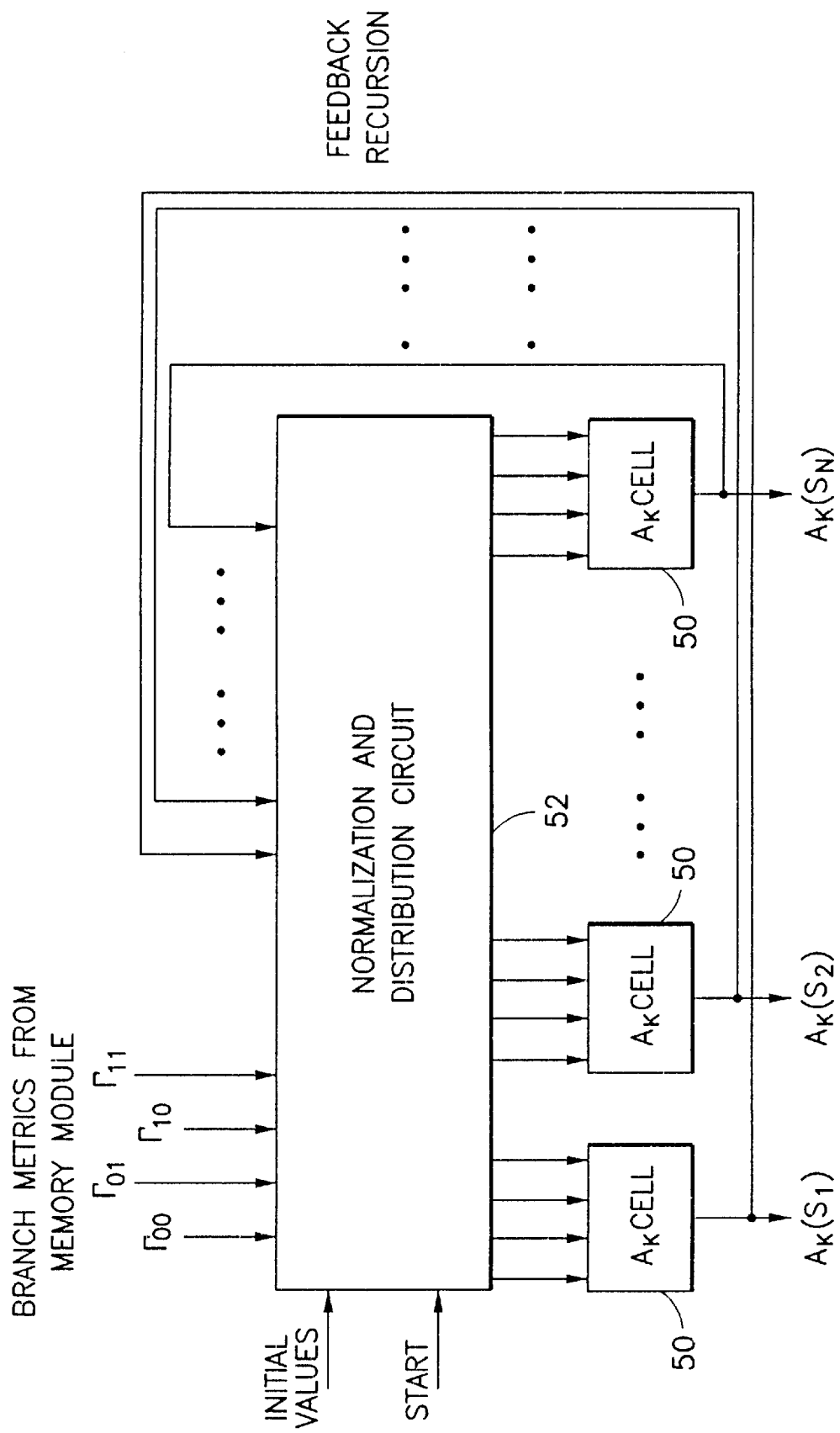
FIG. 11 shows a plurality of the forward recursion cells of FIG. 10 coupled with a normalizer and distribution circuit, wherein the normalizer is constructed accordance with FIG. 9.

FIG. 11 shows a plurality of the forward recursion cells 50 of FIG. 10 coupled with a normalizer and distribution circuit 52 that is constructed in accordance with FIG. 9. The normalizer and distribution circuit 52 operates at first with initial values after receiving the Start signal. The outputs of the $A_k$ cells 50 are then fed back to the inputs, via the normalization and distribution circuit 52, providing feedback recursion as shown. The distribution circuit 52 examines the trellis to determine what states need to be fed into each $A_k$ cell 50. The construction of the B1 and B2 calculators 12 and 14 are similar to that shown in FIG. 10 for the $A_k$ calculator cell 50.

It should be noted that the length of sliding window D in the B1 calculator 12 need not be the same as the length of the sliding window in the B2 calculator 14 (e.g., 16 vs. 10). However, the use of different numbers of channels complicates the required timing. Also, the architecture of the forward recursion calculator A 16 and the backward recursion calculators B1 and B2 12 and 14 may employ N parallel computing cells, where N is the number of states of the trellis, but could as well be implemented with one processor in a time sharing or similar fashion, as was indicated previously.

Those skilled in the art should also realize that the illustrated circuit embodiments of this invention may be provided as one or more integrated circuits, such as in VLSI form, and may be coupled to the output of a suitable receiver for receiving and decoding signals from a communication channel.

Thus, while the invention has been particularly shown and described with respect to preferred embodiments thereof, it will be understood by those skilled in the art that changes in form and details may be made therein without departing from the scope and spirit of the invention.

What is claimed is:

1. A block sliding window data decoder, comprising:
   a forward recursion calculator;
   a plurality of backward recursion calculators comprising a first backward recursion calculator and a second backward recursion calculator that receives inputs from said first backward recursion calculator, said first backward recursion calculator operating every D cycles to perform a backward recursion over received input signals while assuming that all future states are equally likely, where D is a positive integer greater than one; and
   a symbol probability calculator receiving a delayed output of said forward recursion calculator and an input from said second backward recursion calculator.

2. A block sliding window data decoder as in claim 1, and further comprising a memory storing said received input signals, said memory being organized as N cells wherein for each cycle one of the N cells is written while N−1 of the cells are read and read contents of the N−1 of the cells are provided to said forward recursion calculator and to said first and second backward recursion calculators, where N is a number of states of a trellis.

3. A block sliding window data decoder as in claim 1, and further comprising means for normalizing at least signals processed by said forward recursion calculator and said first and second backward recursion calculators.

4. A block sliding window data decoder as in claim 3, wherein said normalizing means is comprised of a plurality of AND logical functions.

5. A method for decoding signals that are received from a communication channel, comprising steps of:
   calculating branch metrics from the received signals;
   storing the calculated branch metrics into a memory;
   reading out previously stored branch metrics from the memory and applying the readout branch metrics to a forward recursion calculator as well as to a first and a second backward recursion calculators that are serially coupled together, the first backward recursion calculator operating every D cycles to perform a backward recursion over the readout stored branch metrics and being initialized to assume that all future states are equally likely, the second backward recursion calculator being initialized to an output of the first backward recursion calculator, where D is a positive integer greater than one; and
   operating a symbol probability calculator that receives a delayed output of the forward recursion calculator and an second backward recursion calculator.

6. A method as in claim 5, wherein the memory is organized as N cells, and wherein for each cycle of the D cycles one of the N cells is written with a newly calculated branch metric while the previously stored branch metric contents of N−1 of the cells are readout, where N is a number of states of a trellis.

7. A method as in claim 5, and further comprising a step of normalizing signals processed by the forward recursion calculator and the first and second backward recursion calculators, the step of normalizing being accomplished with AND logical functions.

* * * * *